(12) United States Patent
Ko

(10) Patent No.: US 7,835,218 B2
(45) Date of Patent: Nov. 16, 2010

(54) SEMICONDUCTOR INTEGRATED CIRCUIT INCLUDING BANK SELECTION CONTROL BLOCK

(75) Inventor: Bok-Rim Ko, Ichon (KR)

(73) Assignee: Hynix Semiconductor Inc. (KR)

( * ) Notice: Subject to any disclaimer, the term of this patent is extended or adjusted under 35 U.S.C. 154(b) by 490 days.

(21) Appl. No.: 12/018,766

(22) Filed: Jan. 23, 2008

(65) Prior Publication Data

US 2009/0059708 A1 Mar. 5, 2009

(30) Foreign Application Priority Data

Sep. 4, 2007 (KR) ............... 10-2007-0089471

(51) Int. Cl.
*G11C 8/00* (2006.01)
(52) U.S. Cl. .................................. 365/230.03
(58) Field of Classification Search ............. 365/230.03
See application file for complete search history.

(56) References Cited

U.S. PATENT DOCUMENTS 6,163,491 A * 12/2000 Iwamoto et al. ............. 365/201
6,353,574 B1 * 3/2002 Shim ....................... 365/189.05
6,449,198 B1 * 9/2002 Hamade et al. ........ 365/189.15
6,850,444 B2 2/2005 Cho

FOREIGN PATENT DOCUMENTS

| JP | 09265775 | 10/1997 |
|----|----------|---------|
| JP | 2005-310345 | 11/2005 |
| JP | 2006-114192 | 4/2006 |
| KR | 1020030097025 | 12/2003 |
| KR | 1020070036492 | 4/2007 |

* cited by examiner

*Primary Examiner*—Hoai V Ho
*Assistant Examiner*—Anthan T Tran
(74) *Attorney, Agent, or Firm*—Baker & McKenzie LLP

(57) ABSTRACT

A semiconductor integrated circuit according to one embodiment can include an up bank block that includes a first group of banks, a down bank block that includes a second group of banks, and a bank selection control block that provides up and down bank even-numbered global line control signals, up and down bank odd-numbered global line control signals, and up and down bank SDRAM write global line control signals in response to first and second group read control signals and a bank information signal in the up bank block and the down bank block. In this case, the bank selection control block may respond to a DDR signal and an SDR signal that are provided from an MRS (Mode Register Set).

25 Claims, 7 Drawing Sheets

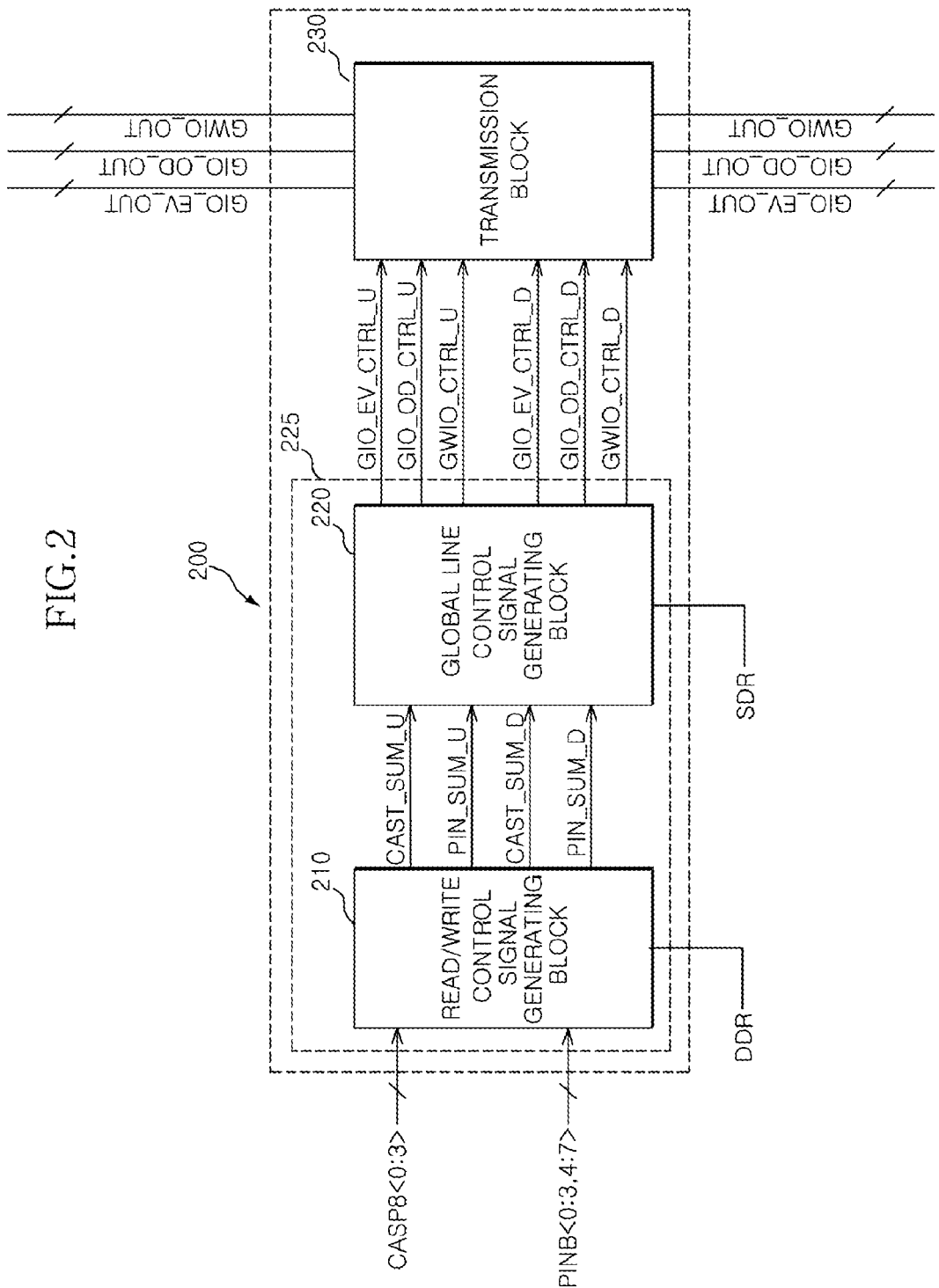

SEMICONDUCTOR INTEGRATED CIRCUIT INCLUDING BANK SELECTION CONTROL BLOCK

CROSS-REFERENCES TO RELATED APPLICATION

The present application claims priority the benefit under 35 U.S.C. 119(a) of Korean application number 10-2007-0089471, filed on Sep. 4, 2007, in the Korean Intellectual Property Office, which is incorporated by reference in its entirety as if set forth in full.

BACKGROUND

1. Technical Field

The disclosure herein relates to a semiconductor integrated circuit, and more particularly, to a semiconductor integrated circuit that is capable of controlling a global input/output line.

2. Related Art

Conventional semiconductor integrated circuits drive global input/output (GIO) lines, which are lines shared by banks of the semiconductor integrated circuit, in response to an external read or write command and then reads or writes data accordingly. Among the global input/output lines, only a selected global input/output line is driven, but since the global input/output lines are shared by all of the banks, the signal is very large during data transmission.

In particular, with recent increases in the integration of a semiconductor integrated circuit chip sizes have been increasing, causing the length of the global input/output line to increase. Full swing of data is generated due to an increase in the load of the global input/output line at the time of reading/writing the data. At the time of toggling, a signal delay occurs, which makes it difficult to achieve a high-speed operation. When the load of the global input/output line increases, current consumption increases.

SUMMARY

A semiconductor integrated circuit that is capable of selectively providing a global input/output line control signal only to a bank block including a selected bank to reduce the load of a global input/output line signal, and achieve low power consumption is described herein.

According to one aspect, a semiconductor integrated circuit can include an up bank block that can include a first group of banks, a down bank block that can include a second group of banks, and a bank selection control block that can provide up and down bank even-numbered global line control signals, up and down bank odd-numbered global line control signals, and up and down bank SDRAM write global line control signals in response to first and second group read control signals and a bank information signal in the up bank block and the down bank block. The bank selection control block can respond to a DDR signal and an SDR signal that are provided from an MRS (Mode Register Set).

According to another aspect, a semiconductor integrated circuit can include an up bank block that can include a first group of banks, a down bank block that can include a second group of banks, a bank control block that provides up and down bank even-numbered global line control signals, up and down bank odd-numbered global line control signals, and up and down bank SDRAM write global line control signals in response to first and second group read control signals and a bank information signal, and a transmission block that can selectively provide output signals of the bank control block to the up bank block and the down bank block. The bank control block can respond to a DDR signal and an SDR signal that are provided from an MRS (Mode Register Set).

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 2 is a block diagram illustrating a bank selection control block that can be included in the circuit illustrated in FIG. 1.

DETAILED DESCRIPTION

Figure 1:
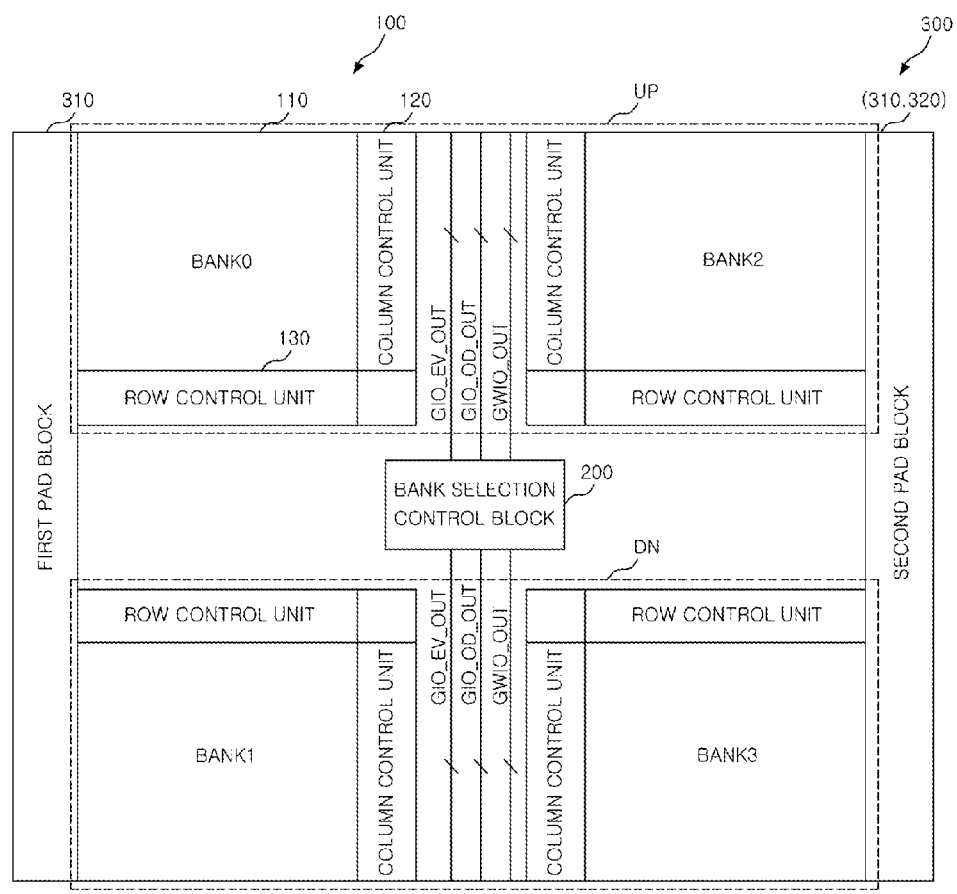
FIG. 1 is a block diagram illustrating a semiconductor integrated circuit according to one embodiment.

FIG. 1 is a conceptual block diagram illustrating a semiconductor integrated circuit including a bank selection control block 200 according to an embodiment. FIG. 2 is a detailed block diagram illustrating the bank selection control block 200 shown in FIG. 1. Referring to FIGS. 1 and 2, a semiconductor integrated circuit includes a memory cell block 100, a bank selection control block 200, and a pad block 300.

The memory cell block 100 can include a first bank 110 (bank 0), a column control unit 120 that can decode or control a column address of the first bank 110, and a row control unit 130 that can decode or control a row address of the first bank 110. For convenience of explanation, the first bank 110 is exemplified, but each of the other banks (banks 1 through 3) can include a row control unit and a column control unit, which will be omitted to avoid the repetitive description.

In one embodiment, according to the arrangement of the banks, the first bank (bank 0) and the third bank (bank 2) can constitute an up bank block UP, and the second bank (bank 1) and the fourth bank (bank 3) can constitute a down bank block DN. However, the embodiments described herein are not limited thereto, and the banks constituting the up bank block or the down bank block may be changed according to the arrangement of the banks.

In one embodiment, the bank selection control block 200 can include a bank control block 225 and a transmission block 230. The bank control block 225 can include a read/write control signal generating block 210 and a global line control signal generating block 220.

First, the read/write control signal generating block 210 can control the up bank block UP and the down bank block DN in response to a bank information signal (CASP8<0:3>), first and second group read control signals (PINB<0:3>) and (PINB<4:7>), and a DDR signal (DDR). More specifically, the read/write control signal generating block 210 can generate an up bank block column control signal (CAST_SUM_U), an up bank block read control signal (PIN_SUM_U), a down bank block column control signal (CAST_SUM_D), and a down bank block read control signal (PIN_SUM_D), which can be configured to control the up bank block UP and the down bank block DN. That is, the read/write control signal generating block 210 can generate control signals that are related to a read/write operation so as to control the read/write operation in the up bank block UP and the down bank block DN according to information of the banks.

In this case, the bank information signal (CASP8<0:3>), as an input signal, is generally used having information for each bank and the burst length (hereinafter, simply referred to as BL). The first and second group read control signals (PINB<0:3>) and (PINB<4:7>) are read control signals that can be generated to correspond to the BL according to a read command in the up bank block and the down bank block. The up bank block column control signal (CAST_SUM_U) and the down bank block column control signal (CAST_SUM_D) are main signals that can control a column system circuit according to a write command. In this case, the DDR signal (DDR) is an information signal that is provided from an MRS (Mode Register Set) which can allow the operation to be performed in a DDR operation mode.

In response to the up bank block column control signal (CAST_SUM_U), the up bank block read control signal (PIN_SUM_U), the down bank block column control signal (CAST_SUM_D), the down bank block read control signal (PIN_SUM_D), and an SDR signal (SDR), the global line control signal generating block 220 can provide up and down bank even-numbered global line control signals (GIO_EV_CTRL_U) and (GIO_EV_CTRL_D), up and down bank odd-numbered global line control signals (GIO_OD_CTRL_U) and (GIO_OD_CTRL_D), and up and down bank SDRM can write global signals (GWIO_CTRL_U) and (GWIO_CTRL_D).

The up and down bank even-numbered global line control signals (GIO_EV_CTRL_U) and (GIO_EV_CTRL_D), and the up and down bank odd-numbered global line control signals (GIO_OD_CTRL_U) and (GIO_OD_CTRL_D) can transmit data at the time of the read/write operation in a DDR (Double Date Rate) circuit. In the DDR circuit, since data are output in synchronization with both edges of a clock, the 2-bit prefetch is generally used. Thus, the up and down bank even-numbered global line control signals (GIO_EV_CTRL_U) and (GIO_EV_CTRL_D), and the up and down bank odd-numbered global line control signals (GIO_OD_CTRL_U) and (GIO_OD_CTRL_D) can be used to discriminatively control the odd-numbered global lines and the even-numbered global lines, in order to apply the 2-bit prefetch in the DDR circuit.

Meanwhile, one embodiment exemplifies a semiconductor integrated circuit that has a combination type of the DDR and an SDRAM (Synchronous Dynamic Random Access Memory). Accordingly, it is possible to implement a separate global input/output line as a signal line to transmit data for the read/write operation in the SDRAM circuit. At the time of the read operation in the SDRAM circuit, the up and down bank even-numbered global line control signals (GIO_EV_CTRL_U) and (GIO_EV_CTRL_D), and the up and down bank odd-numbered global line control signals (GIO_OD_CTRL_U) and (GIO_OD_CTRL_D), can be used to control the even-numbered global lines and the odd-numbered global lines. However, at the time of the write operation in the SDRAM circuit, global input/output lines for write can be separately provided to reduce the load of the signal lines. Therefore, in one embodiment, the up and down bank SDRAM write global line control signals (GWIO_CTRL_U) and (GWIO_CTRL_D) can be provided. Here, the SDR signal (SDR) can be an information signal that is provided from the MRS and can allow the operation to be performed in an SDRAM mode.

The transmission block 230 can receive output signals from the global line control signal generating block 220, and can perform a control operation such that the output signals can be selectively transmitted to the up bank block UP and the down bank block DN. As a result, the global input/output lines can be driven only in the selected bank block, thereby reducing the load of the signals. In one embodiment, the global input/output lines mean lines that can include the odd-numbered global lines, the even-numbered global lines, and the SDRAM write global lines.

Figure 3A:
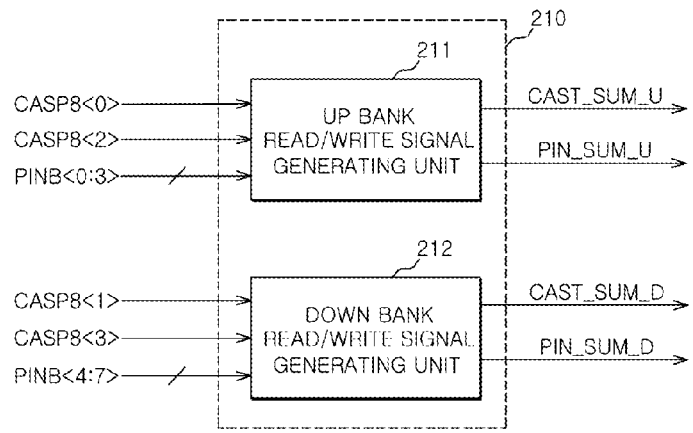
FIGS. 3A and 3B are a conceptual block diagram and a partial circuit diagram illustrating a read/write control signal generating block, respectively.
Figure 3B:
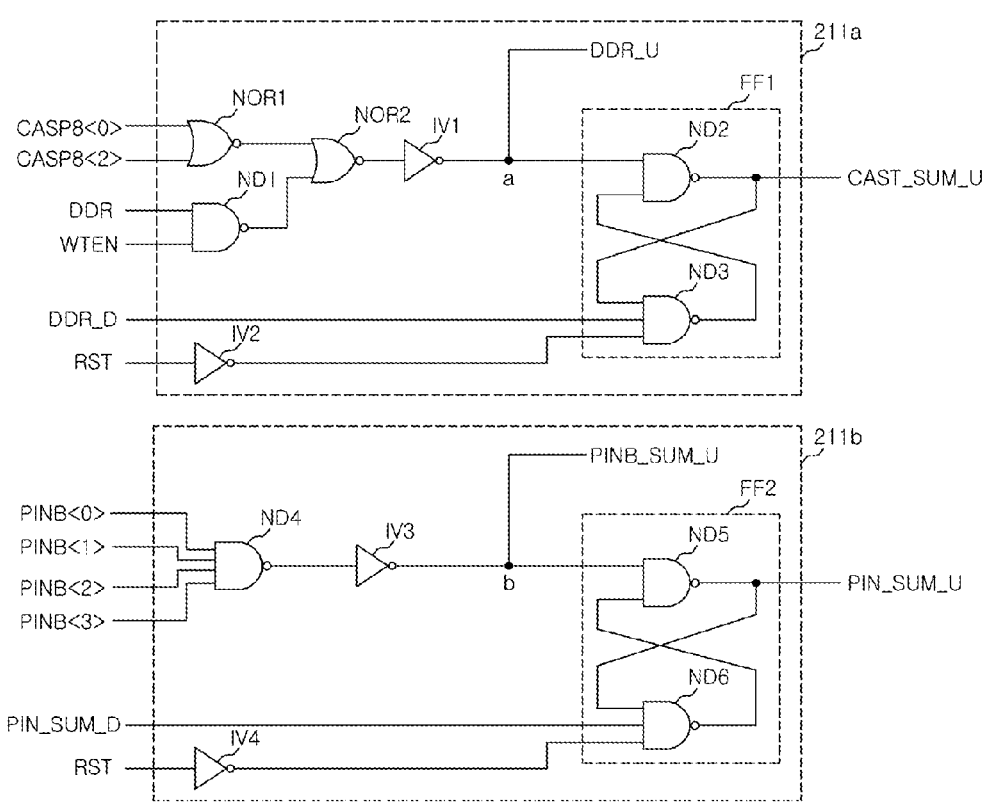

FIGS. 3A and 3B are a conceptual block diagram and a partial circuit diagram illustrating a read/write control signal generating block, respectively, in accordance with one embodiment. Referring to FIGS. 3A and 3B, the read/write control signal generating block 210 can include an up bank read/write signal generating unit 211 and a down bank read/write signal generating unit 212. A circuit diagram of the down bank read/write signal generating unit 212 is not shown because the structure of the down bank read/write signal generating unit 212 can be the same as that of the up bank read/write signal generating unit 211, except for the input signals and the output signals. Therefore, only the up bank read/write signal generating unit 211 is described in detail below.

The up bank read/write signal generating unit 211 can include an up bank column control signal generator 211a and an up bank read control signal generator 211b.

When the write command is activated during the DDR operation mode, the up bank column control signal generator 211a can generate the up bank block column control signal (CAST_SUM_U) in response to the first and third bank information signals (CASP8<0>) and (CASP8<2>). Specifically, the up bank column control signal generator 211a can receive the first and third bank information signals (CASP8<0>) and (CASP8<2>), a DDR information signal (DDR, a write activation signal (WTEN), a down bank column activation information signal (DDR_D), and a reset signal (RST), and generate an up bank column activation information signal (DDR_U) and an up bank block column control signal (CAST_SUM_U).

The up bank column control signal generator 211a can include a first NOR gate NOR1 that can determine the banks, a first NAND gate ND1 that can determine the DDR and write operations, and a first flip flop FF1.

The first NOR gate NOR1 can receive the first and third bank information signals (CASP8<0>) and (CASP8<2>) and can provide information indicating whether a selected bank exists in the up bank block (see UP of FIG. 1). That is, the first and third bank information signals (CASP8<0>) and (CASP8<2>) can include information for the banks that can be included in the up bank block (see UP of FIG. 1). The first NAND gate ND1 can receive the DDR information signal (DDR) and the write activation signal (WTEN) and can provide information indicating whether a write operation is performed in the DDR circuit. The first flip flop FF1 can be composed of a NAND-typed flip flop, and can include second and third NAND gates ND2 and ND3. The first flip flop FF1 can receive a signal at a node a and latch a level of the up bank block column control signal (CAST_SUM_U). Then, the first flip flop FF1 can invert the level of the up bank block column control signal (CAST_SUM_U) in response to signals received by an input terminal of the third NAND gate ND3.

This can be exemplified in an example in which a write operation is performed in any one of the banks of the up bank block (see UP of FIG. 1) in the DDR circuit.

The operation of the up bank column control signal generator 211a according to one embodiment will be described. In response to any one of the first and third bank information signals (CASP8<0>) and (CASP8<2>) that is activated at a high level, the first NOR gate NOR1 can provide a low-level signal. In response to the DDR information signal (DDR) and the write activation signal (WTEN) that are activated at a high level, the first NAND gate ND1 can provide a low-level signal. Then, the second NOR gate NOR2 can receive output signals of the first NOR gate NOR1 and the first NAND gate ND1 and can provide a high-level signal. Therefore, an output signal of the second NOR gate NOR2 can be inverted by the first inverter IV1, and the up bank column activation information signal (DDR_U), which is activated at a low level, can be provided. That is, it is possible to provide the up bank column activation information signal (DDR_U) indicating that the up bank block (see UP of FIG. 1) is activated when a bank information signal corresponding to the up bank block is activated. The up bank column activation information signal (DDR_U) can be fed back to a down bank column control signal generator (not shown) so as to control the signals related to the down bank not to be activated. Further, the second NAND gate ND2 of the first flip flop FF1 can receive a low-level signal at the node a, and the first flip flop FF1 provides the up bank block column control signal (CAST_SUM_U) that is activated at a high level.

The down bank column activation information signal (DDR_D) can have a level that is opposite to a level of the up bank column activation information signal (DDR_U), which thus corresponds to a high-level signal. The reset signal (RST) can be maintained at a low level until the rest signal (RST) resets the operation of the circuit. Therefore, the third NAND gate ND3 of the first flip flop FF1 can receive only the high-level signals, and output a low-level signal to the second NAND gate ND2. The up bank column control signal generator 211a can latch the high-level up bank block column control signal (CAST_SUM_U) until the level of the down bank information signal (DDR_D) or the reset signal (RST) is changed. That is, the up bank column control signal generator 211a can generate the up bank block column control signal (CAST_SUM_U), which can be activated by the activated bank information signals (CASP8<0>) and (CASP8<2>) at the time of the write operation in the DDR circuit. Meanwhile, a control operation needs to be performed such that the down bank block (see DN of FIG. 1) is inactivated during the activation period of the up bank block (see UP of FIG. 1). When the down bank block (see DN of FIG. 1) is activated, the up bank block (see UP of FIG. 1) should be inactivated. Accordingly, if using the up bank column activation information signal (DDR_U) and the down bank column activation information signal (DDR_D), then it is possible to perform a control operation such that, when any one of the bank blocks is activated, the other bank block is inactivated.

As described above, at the time of the read operation, the odd-numbered global lines and the even-numbered global lines can be used in the DDR circuit or the SDRAM circuit. Accordingly, since the up bank read control signal generator 211b can generate a common read control signal, and separate information for the DDR circuit or the SDRAM circuit is not required.

The up bank read control signal generator 211b can include a fourth NAND gate ND4 and a second flip flop FF2. The second flip flop FF2 can include fifth and sixth NAND gates ND5 and ND6. The fourth NAND gate ND4 can receive first group read control signals (PINB<0:3>) and provide an output signal that is obtained by performing a NAND operation on the first group read control signals (PINB<0:3>). The second flip flop FF2 can receive the up bank read information signal (PINB_SUM_U), the down bank read information signal (PINB_SUM_D), and the reset signal (RST), and provide the up bank block read control signal (PIN_SUM_U).

This can be exemplified in a read operation from the up bank block is performed in the DDR circuit or the SDRAM circuit. The operation of the up bank read control signal generator 211b will now be described according to one embodiment. The fourth NAND gate ND4 can receive the first group read control signals (PINB<0:3>) that can be activated at a low level and provide a high-level signal, which can be inverted by the third inverter IV3 and provided to the node b as a low-level signal. As a result, the up bank read control signal generator 211b can provide the up bank read information signal (PINB_SUM_U) that can be activated at a low level. The up bank read information signal (PINB_SUM_U) can inactivate the down bank block read control signal (PIN_SUM_D). Meanwhile, the second flip flop FF2 can provide a high-level up bank block read control signal (PIN_SUM_U) through the fifth NAND gate ND5 that has received the low-level signal at the node b. In the same method as the above-described operation principle of the up bank column control signal generator 211a, the up bank read control signal generator 211b can also provide the up bank read information signal (PINB_SUM_U) indicating that the up bank can be activated in the up bank block (see UP of FIG. 1) in response to the activated first group read control signal (PINB<0:3>) according to the read command. According to the up bank read information signal (PINB_SUM_U), the down bank read information signal (PINB_SUM_D) is not activated. Also, the up bank read control signal generator 211b can maintain the up bank block read control signal (PIN_SUM_U) that is activated at a high level, until the down bank read information signal (PINB_SUM_D) or the reset information signal (RST) is activated.

Figure 4A:
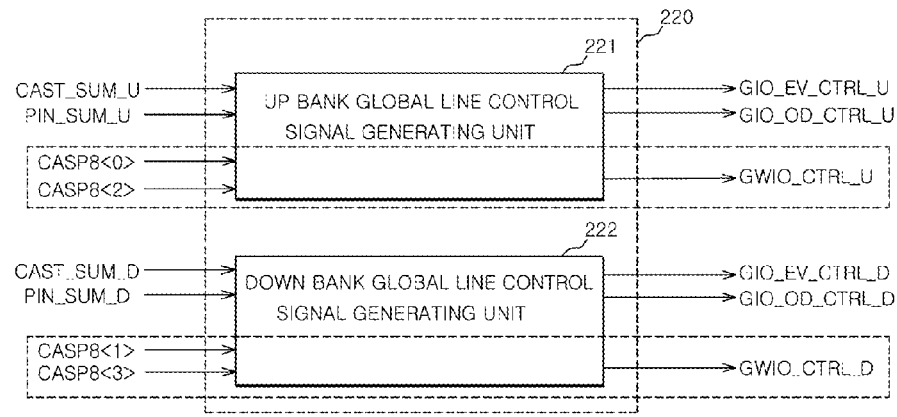
FIGS. 4A and 4B are a conceptual block diagram and a partial circuit diagram illustrating a global line control signal generating block, respectively.
Figure 4B:
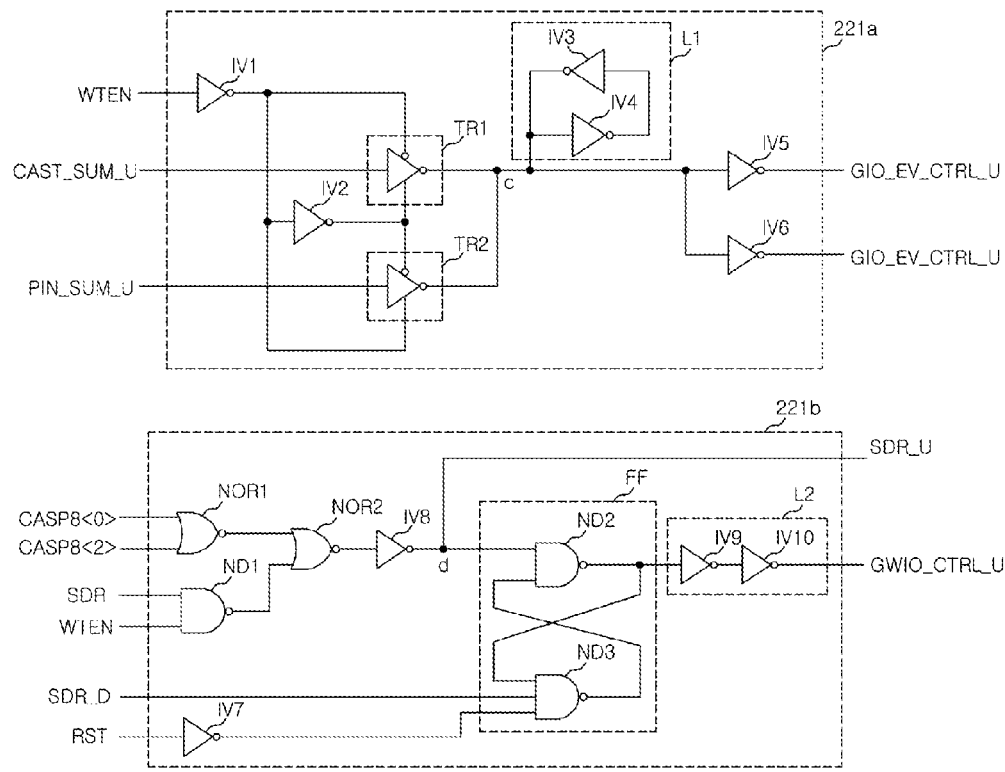

FIGS. 4A and 4B are a conceptual block diagram and a partial circuit diagram illustrating a global line control signal generating block, respectively, in accordance with one embodiment. Referring to FIGS. 4A and 4B, the global line control signal generating block 220 can include an up bank global line control signal generating unit 221 and a down bank global line control signal generating unit 222. A circuit diagram of the down bank global line control signal generating unit 222 is omitted because the structure of the down bank global line control signal generating unit 222 can be the same as that of the up bank global line control signal generating unit 221, except for the input signals and the output signals. Therefore, the up bank global line control signal generating unit 221 is only described in detail below.

The up bank global line control signal generating unit 221 can include an up bank even-numbered/odd-numbered global line control signal generator 221a and an up bank SDRAM write global signal generator 221b.

First, the up bank even-numbered/odd-numbered global line control signal generator 221a can receive the write activation signal (WTEN), the up bank block column control signal (CAST_SUM_U), and the up bank block read control signal (PIN_SUM_U), and generate the up bank even-numbered global line control signal (GIO_EV_CTRL_U), and the up bank odd-numbered global line control signal (GIO_OD_CTRL_U). The up bank even-numbered/odd-numbered global line control signal generator 221a can include first and second transmission gates TR1 and TR2 that function as first and second transmission units, and a first latch L1.

The first transmission gate TR1 and the second transmission gate TR2 can be selectively turned on by first and second inverters IV1 and IV2 that receive the write activation signal (WTEN). When the first transmission gate TR1 is turned on, the first transmission gate TR1 can invert the up bank block column control signal (CAST_SUM_U) and transmit the inverted signal. When the second transmission gate TR2 is turned on, the second transmission gate TR2 can invert the up bank block read control signal (PIN_SUM_U) and transmit the inverted signal. The first latch L1 can include third and fourth inverters IV3 and IV4, and latch a level of the signal at the node c.

The operation of the up bank even-numbered/odd-numbered global line control signal generator 221a will be described. If the write activation signal (WTEN) is activated at a high level according to the write command, the first transmission gate TR1 can be turned on. At this time, when the up bank block column control signal (CAST_SUM_U) is activated at a high level, that is, when a write operation can be performed on the up bank block (see UP of FIG. 1), the up bank even-numbered and odd-numbered global line control signals (GIO_EV_CTRL_U) and (GIO_OD_CTRL_U), which can be activated at a high level by the first transmission gate TR1 and the fifth inverter IV5, can be provided. Then, if the high-level up bank even-numbered and odd-numbered global line control signals (GIO_EV_CTRL_U) and (GIO_OD_CTRL_U) are provided, then it is possible to control the even-numbered and odd-numbered global lines of the up bank block (see UP of FIG. 1) at the time of the write operation in the DDR circuit.

If the read operation needs to be performed according to the read command, the write activation signal (WTEN) can be inactivated at a low level. At this time, the second transmission gate TR2 can be turned on, and can transmit the inverted up bank block read control signal (PIN_SUM_U). The high-level up bank block read control signal (PIN_SUM_U) can be provided by the second transmission gate TR2 and the sixth inverter IV6. As a result, it is possible to control the even-numbered and odd-numbered global lines only in the up bank block (see UP of FIG. 1) at the time of the read operation in the DDR circuit or the SDRAM circuit.

Meanwhile, the up bank SDRAM write global signal generator 221b shown in FIG. 4B may be further provided to provide an SDRAM write global signal to apply a combination type of the DDR and the SDRAM. Since the up bank SDRAM write global signal generator 221b has a structure similar to that of the up bank column control signal generator 211a shown in FIG. 3B, the structure thereof will be simply described.

The up bank SDRAM write global signal generator 221b can be different from the up bank column control signal generator 211a shown in FIG. 3B in that the SDRAM circuit information can be used instead of the DDR circuit information. Meanwhile, the reason why a second latch L2 is further included in the up bank SDRAM write global signal generator 221b is because a predetermined delay time needs to be ensured in order to match the output timing of an up bank SDRAM write global control signal (GWIO_CTRL_U) to the output timing of the up bank even-numbered and odd-numbered global line control signals (GIO_EV_CTRL_U) and (GIO_OD_CTRL_U). The number of delay elements of the second latch L2 can be increased or decreased according to the object.

The up bank SDRAM write global signal generator 221b can include a first NOR gate NOR1 that determines the banks, a first NAND gate ND1 that can determine the SDRAM and write operations, and a flip flop FF.

The first NOR gate NOR1 can receive first and third bank information signals (CASP8<0>) and (CASP8<2>) and can be configured to provide information indicating whether a selected bank exists in the up bank block (see UP of FIG. 1). The first NAND gate ND1 can receive the SDRAM information signal (SDR) and the write activation signal (WTEN), and provide information indicating whether a write operation is performed in the SDRAM circuit. The flip flop FF can be composed of a NAND-typed flip flop, and include second and third NAND gates ND2 and ND3. The flip flop FF can receive a signal at a node d and latch the level of the up bank SDRAM write global signal (GWIO_CTRL_U). Then, the flip flop FF can invert the level of the up bank SDRAM write global signal (GWIO_CTRL_U) in response to the signals that are received by the input terminal of the third NAND gate ND3.

The up bank SDRAM write global signal generator 221b can provide the activated up bank SDRAM activation information signal (SDR_U) in response to the signal having bank information activated according to the write command in the SDRAM circuit. The up bank SDRAM write global signal generator 221b can provide the activated up bank SDRAM write global signal (GWIO_CTRL_U). The up bank SDRAM activation information signal (SDR_U) can control the up bank SDRAM write global signal (GWIO_CTRL_U) to be activated and the down bank SDRAM write global signal (GWIO_CTRL_D) of the down bank global line control signal generating unit 222 to be inactivated.

Figure 5A:
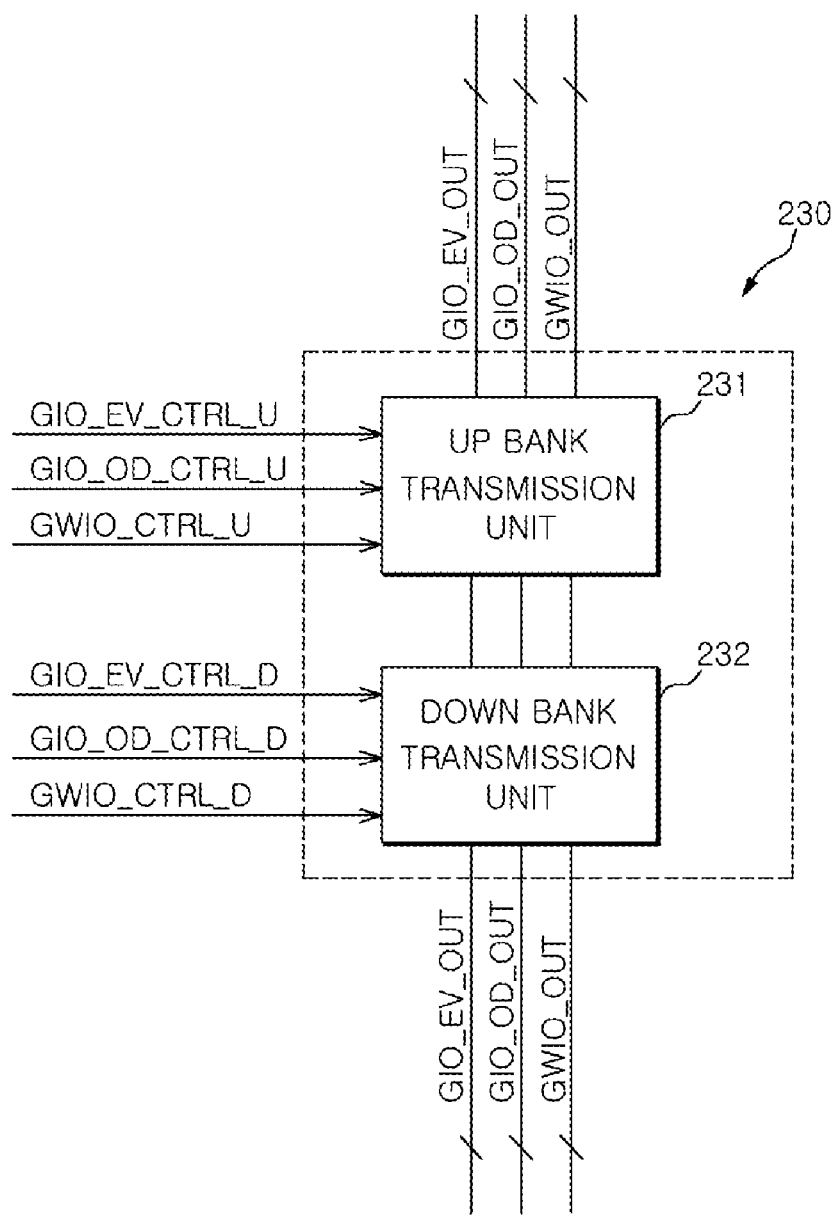
FIGS. 5A and 5B are a block diagram and a circuit diagram illustrating a transmission block, respectively.
Figure 5B:
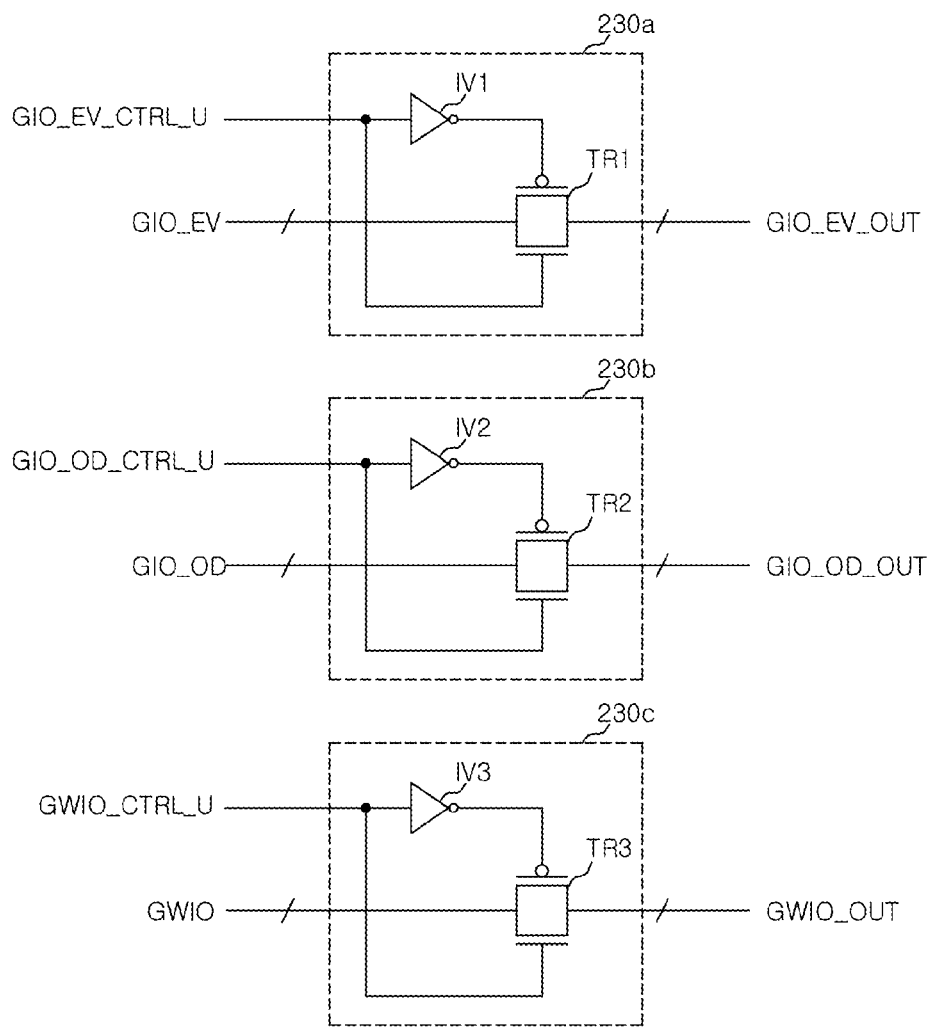

FIGS. 5A and 5B are a block diagram and a circuit diagram illustrating a transmission block 230, respectively, in accordance with one embodiment. Referring to FIGS. 5A and 5B, the transmission block 230 can include an up bank transmission unit 231 and a down bank transmission unit 232. The up bank transmission unit 231 can transmit the signals from the global input/output lines shared by all the banks to the up bank block (see UP of FIG. 1) or prohibit the signals to be transmitted to the up bank block. In contrast, the down bank transmission unit 232 can transmit the signals from the global input/output lines to the down bank block (see DN of FIG. 1) or prohibit the signals to be transmitted to the down bank block. Accordingly, the load of the global signals can be reduced to half of the load in the related art. For convenience of explanation, the detailed circuit diagram of the down bank transmission unit 232 is omitted. However, the structure of the down bank transmission unit 232 can be the same as the structure of the up bank transmission unit 231 except for the control signals. The up bank transmission unit 231 can include first to third transmission units 230a to 230c.

First, the first transmission unit 230a can include a first transmission gate TR1. The first transmission unit 230a can provide the even-numbered global line signal (GIO_EV) as an output signal (GIO_EV_OUT) in response to the activated up bank even-numbered global line control signal (GIO_EV_CTRL_U).

The second transmission unit 230b can include a second transmission gate TR2. The second transmission unit 230b can provide the odd-numbered global line signal (GIO_OD) as an output signal (GIO_OD_OUT) in response to the activated up bank odd-numbered global control signal (GIO_OD_CTRL_U).

The third transmission unit 230c can include a third transmission gate TR3. The third transmission unit 230c can provide the SDRAM write global line signal (GWIO) as an output signal (GWIO_OUT) in response to the activated up bank SDRAM write global line control signal (GWIO_CTRL_U).

Accordingly, when the transmission gates are activated, the signals can be transmitted to the up bank block (see UP of FIG. 1). Further, when the transmission gates are inactivated, it is prohibited for the signals to be transmitted to the up bank block (see UP of FIG. 1), thereby reducing the load of the signals.

Figure 6:
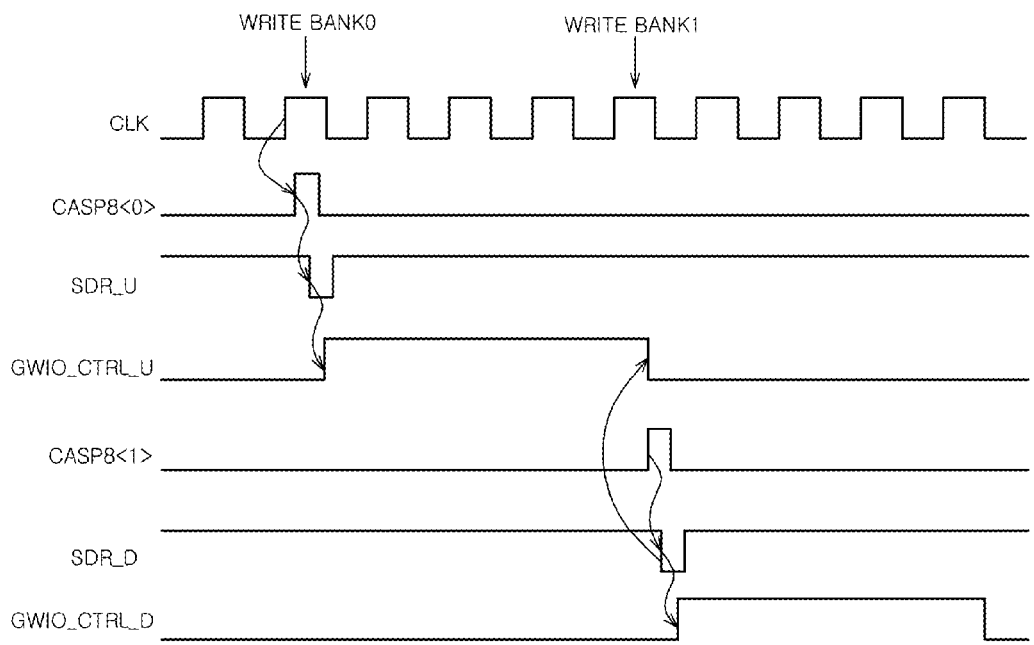
FIGS. 6 and 7 are timing diagrams illustrating the write operation and the read operation for the bank selection control block illustrated in FIG. 2, respectively.
Figure 7:
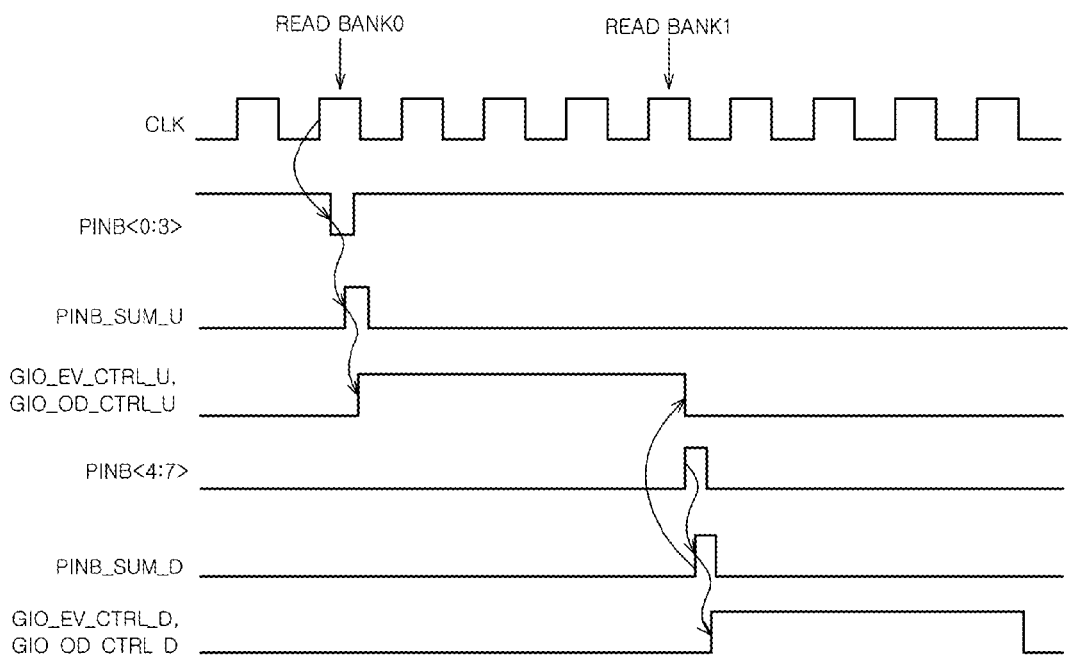

FIGS. 6 and 7 are timing charts illustrating the write operation and the read operation for the bank selection control block 200 shown in FIG. 2, respectively. For example, FIGS. 6 and 7 are timing charts illustrating a write operation and a read operation in the up bank block and the down bank block in the case of the SDRAM, respectively.

First, when a write operation is performed in the first bank (bank 0) according to the first bank information signal (CASP8<0>), the up bank SDRAM write global line control signal (GWIO_CTRL_U) can be activated in response to the up bank SDRAM activation information signal (SDR_U). The up bank SDRAM write global line control signal (GWIO_CTRL_U) can be activated to correspond to the BL, and can then be inactivated by the down bank SDRAM activation information signal (SDR_D) of the down bank block. That is, the down bank SDRAM activation information signal (SDR_D) can be activated by the activated second bank information signal (CASP8<1>). The down bank SDRAM activation information signal (SDR_D) inactivate the up bank SDRAM write global line control signal (GWIO_CTRL_U) and activate the down bank SDRAM write global line control signal (GWIO_CTRL_D). That is, the activated down bank SDRAM activation information signal (SDR_D) or the activated up bank SDRAM activation information signal (SDR_U) can be used as the control signal that controls the SDRAM write global line control signal of the selected bank block to be activated and the SDRAM write global line control signal of the non-selected bank block to be inactivated.

As shown in FIG. 7, when the read operation is performed by the first group read control signal (PINB<0:3>), the up bank even-numbered and odd-numbered global line control signals (GIO_EV_CTRL_U) and (GIO_OD_CTRL_U) can be activated in response to the up bank read activation signal (PINB_SUM_U). The up bank even-numbered and odd-numbered global line control signals (GIO_EV_CTRL_U) and (GIO_OD_CTRL_U) can be activated to correspond to the BL, and then inactivated by the activated down bank read activation information signal (PINB_SUM_D) of the down bank block. That is, the down bank read activation information signal (PINB_SUM_D) can be activated by the activated second group read control signal (PINB<4:7>). The down bank read activation information signal (PINB_SUM_D) can inactivate the up bank even-numbered and odd-numbered global line control signals (GIO_EV_CTRL_U) and (GIO_OD_CTRL_U) and can activate the down bank even-numbered/odd-numbered global line control signals (GIO_EV_CTRL_D) and (GIO_OD_CTRL_D). That is, the activated down bank read activation information signal (PINB_SUM_D) or the activated up bank read activation signal (PINB_SUM_U) can be used as a control signal that controls the even-numbered and odd-numbered global line control signals of the selected bank block to activated, and the even-numbered and odd-numbered global line control signals of the non-selected bank block to be inactivated.

As described above, according to one embodiment, the control operation can be performed such that the global input/output lines transmitting the data are driven only in the bank block including the selected bank. That is, the banks can be divided into the bank blocks, the global input/output line control signals are selectively activated only in the bank block that includes the bank where the operations are to be performed, and the data is transmitted through the activated global input/output lines. Accordingly, in the bank block that can include the non-selected bank, the global input/output lines are not driven, thereby reducing the current consumption. The signal delay can be reduced by selectively controlling the bank block and reducing the load of the signals.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor integrated circuit comprising:
an up bank block that includes a first group of banks;
a down bank block that includes a second group of banks; and
a bank selection control block that provides up and down bank even-numbered global line control signals, up and down bank odd-numbered global line control signals, and up and down bank SDRAM write global line control signals in response to first and second group read control signals and a bank information signal in the up bank block and the down bank block,
wherein the bank selection control block responds to a DDR signal and an SDR signal that are provided from an MRS (Mode Register Set).

2. The semiconductor integrated circuit of claim 1,
wherein the up and down bank SDRAM write global line control signals control SDRAM write global lines to be selectively driven in the up bank block and the down bank block in response to the SDR signal, and
the up and down bank even-numbered global line control signals and the up and down bank odd-numbered global line control signals control even-numbered global lines and odd-numbered global lines to be selectively driven in the up bank block and the down bank block.

3. The semiconductor integrated circuit of claim 1,
wherein the bank selection control block comprises:
a read/write control signal generating block that generates an up bank block column control signal, a down bank block column control signal, an up bank block read control signal, and a down bank block read control signal in response to the bank information signal, the first and second group read control signals, and a write activation signal;
a global line control signal generating block that provides the up and down bank even-numbered global line control signals by receiving the up and down bank block column control signals and the up and down bank block read control signals, and provides the up and down bank SDRAM write global line control signals in response to the SDR signal and the bank information signal; and
a transmission block that receives output signals of the global line control signal generating block and selectively transmits the output signals to the up bank block and the down bank block through even-numbered global lines and odd-numbered global lines.

4. The semiconductor integrated circuit of claim 3,
wherein the read/write control signal generating block comprises:

an up bank read/write signal generating unit that generates the up bank block column control signal and the up bank block read control signal to control a read/write operation in the up bank block; and a down bank read/write signal generating unit that generates the down bank block column control signal and the down bank block read control signal to control a read/write operation in the down bank block.

5. The semiconductor integrated circuit of claim 4, wherein the up bank read/write signal generating unit comprises:

an up bank column control signal generator that generates an up bank column activation information signal and the up bank block column control signal, which are activated in response to a bank information signal of any one of activated banks of the up bank block according to a write command; and an up bank read control signal generator that generates an up bank read activation information signal and the up bank block read control signal, which are activated in response to the activated first group read control signal according to a read command.

6. The semiconductor integrated circuit of claim 5, wherein the down bank read/write signal generating unit comprises:

a down bank column control signal generator that generates a down bank column activation information signal and the down bank block column control signal, which are activated in response to a bank information signal of any one of activated banks of the down bank block according to a write command; and a down bank read control signal generator that generates a down bank read activation information signal and the down bank block read control signal, which are activated in response to the activated second group read control signal according to a read command.

7. The semiconductor integrated circuit of claim 6, wherein the up bank column activation information signal is fed back to the down bank column control signal generator and the down bank column activation information signal is fed back to the up bank column control signal generator, and the activated up bank column activation information signal inactivates the down bank block column control signal and the activated down bank column activation information signal inactivates the up bank block column control signal.

8. The semiconductor integrated circuit of claim 6, wherein the up bank read activation information signal is fed back to the down bank read control signal generator and the down bank read activation information signal is fed back to the up bank read control signal generator, and the activated up bank read activation information signal inactivates the down bank block read control signal and the activated down bank read activation information signal inactivates the up bank block read control signal.

9. The semiconductor integrated circuit of claim 3, wherein the global line control signal generating block comprises:

an up bank global line control signal generating unit that generates the up bank even-numbered global line control signal and the up bank odd-numbered global line control signal in response to the up bank block column control signal, the up bank block read control signal, and a write enable signal, and generates an up bank SDRAM write global control signal in response to a bank information signal of an activated bank of the up bank block, when the SDR signal and the write enable signal are activated; and a down bank global line control signal generating unit that generates the down bank even-numbered global line control signal and the down bank odd-numbered global line control signal in response to the down bank block column control signal, the down bank block read control signal, and the write enable signal, and generates a down bank SDRAM write global control signal in response to a bank information signal of an activated bank of the down bank block, when the SDR signal and the write enable signal are activated.

10. The semiconductor integrated circuit of claim 9, wherein the up bank global line control signal generating unit comprises:

a first transmission unit that transmits the up bank block column control signal, when the write enable signal is activated;

a second transmission unit that transmits the up bank block read control signal, when the write enable signal is inactivated; and an up bank SDRAM write global line control signal generator that generates an up bank SDRAM activation information signal and the up bank SDRAM write global line control signal, which are activated in response to a bank information signal of any one of activated banks of the up bank block, when the SDR signal and the write enable signal are activated.

11. The semiconductor integrated circuit of claim 10, wherein the down bank global line control signal generating unit comprises:

a first transmission unit that transmits the down bank block column control signal, when the write enable signal is activated;

a second transmission unit that transmits the down bank block read control signal, when the write enable signal is inactivated; and a down bank SDRAM write global line control signal generator that generates a down bank SDRAM activation information signal and the down bank SDRAM write global line control signal, which are activated in response to a bank information signal of any one of activated banks of the down bank block, when the SDR signal and the write enable signal are activated.

12. The semiconductor integrated circuit of claim 11, wherein the up bank SDRAM activation information signal is fed back to the down bank SDRAM write global line control signal generator and the down bank SDRAM activation information signal is fed back to the up bank SDRAM write global line control signal generator, and the activated up bank column activation information signal inactivates the down bank block column control signal and the activated down bank column activation information signal inactivates the up bank block column control signal.

13. The semiconductor integrated circuit of claim 3, wherein the transmission block comprises:

an up bank transmission unit that receives the up bank even-numbered global line control signal, the up bank odd-numbered global line control signal, and the up bank SDRAM write global line control signal, and controls the even-numbered global lines, the odd-numbered global lines, and a SDRAM write global line to be selectively driven in the up bank block; and a down bank transmission unit that receives the down bank even-numbered global line control signal, the down bank odd-numbered global line control signal, and the down bank SDRAM write global line control signal, and controls the even-numbered global lines, the odd-numbered global lines, and an SDRAM write global line to be selectively driven in the down bank block.

14. The semiconductor integrated circuit of claim 13, wherein the up bank transmission unit comprises:
a first transmission unit that provides the even-numbered global line signal as an output signal to the up bank block in response to the activated up bank even-numbered global line control signal;
a second transmission unit that provides the odd-numbered global line signal as an output signal to the up bank block in response to the activated up bank odd-numbered global line control signal; and
a third transmission unit that provides the SDRAM write global signal as an output signal to the up bank block in response to the activated up bank SDRAM write global line control signal.

15. The semiconductor integrated circuit of claim 13, wherein the down bank transmission unit comprises:
a first transmission unit that provides the even-numbered global line signal as an output signal to the down bank block in response to the activated down bank even-numbed global line control signal;
a second transmission unit that provides the odd-numbered global line signal as an output signal to the down bank block in response to the activated down bank odd-numbered global line control signal; and
a third transmission unit that provides the SDRAM write global signal as an output signal to the down bank block in response to the activated down bank SDRAM write global line control signal.

16. A semiconductor integrated circuit comprising:
an up bank block that includes a first group of banks;
a down bank block that includes a second group of banks;
a bank control block that provides up and down bank even-numbered global line control signals, up and down bank odd-numbered global line control signals, and up and down bank SDRAM write global line control signals in response to first and second group read control signals and a bank information signal; and
a transmission block that selectively provides output signals of the bank control block to the up bank block and the down bank block,
wherein the bank control block responds to a DDR signal and an SDR signal that are provided from an MRS (Mode Register Set).

17. The semiconductor integrated circuit of claim 16, wherein the up and down bank SDRAM write global line control signals control SDRAM write global lines to be selectively driven in the up bank block and the down bank block in response to the SDR signal, and
the up and down bank even-numbered global line control signals and the up and down bank odd-numbered global line control signals control even-numbered global lines and odd-numbered global lines to be selectively driven in the up bank block and the down bank block.

18. The semiconductor integrated circuit of claim 16, wherein the bank control block comprise:
a read/write control signal generating block that generates an up bank block column control signal, a down bank block column control signal, an up bank block read control signal, and a down bank block read control signal in response to the bank information signal, the first and second group read control signals, and a write activation signal; and a global line control signal generating block that receives the up and down bank block column control signals and the up and down bank block read control signals and provides the up and down bank even-numbered global line control signals and the up and down bank odd-numbered global line control signals, and provides the up and down bank SDRAM write global line control signals in response to the SDR signal and the bank information signal.

19. The semiconductor integrated circuit of claim 18, wherein the read/write control signal generating block comprises:
an up bank read/write signal generating unit that generates an up bank block column control signal and an up bank block read control signal to control a read/write operation in the up bank block; and
a down bank read/write signal generating unit that generates a down bank block column control signal and a down bank block read control signal to control a read/write operation in the down bank block.

20. The semiconductor integrated circuit of claim 19, wherein the up bank read/write signal generating unit comprises:
an up bank column control signal generator that generates an up bank column activation information signal and the up bank block column control signal, which are activated in response to a bank information signal of any one of activated banks of the up bank block according to a write command; and
an up bank read control signal generator that generates an up bank read activation information signal and the up bank block read control signal, which are activated in response to the activated first group read control signal according to a read command.

21. The semiconductor integrated circuit of claim 19, wherein the down bank read/write signal generating unit comprises:
a down bank column control signal generator that generates a down bank column activation information signal and the down bank block column control signal, which are activated in response to a bank information signal of any one of activated banks of the down bank block according to a write command; and
a down bank read control signal generator that generates a down bank read activation information signal and the down bank block read control signal, which are activated in response to the activated second group read control signal according to a read command.

22. The semiconductor integrated circuit of claim 18, wherein the global line control signal generating block comprises:
an up bank global line control signal generating unit that generates the up bank even-numbered global line control signal and the up bank odd-numbered global line control signal in response to the up bank block column control signal, the up bank block read control signal, and a write enable signal, and generates an up bank SDRAM write global control signal in response to a bank information signal of an activated bank of the up bank block, when the SDR signal and the write enable signal are activated; and
a down bank global line control signal generating unit that generates the down bank even-numbered global line control signal and the down bank odd-numbered global line control signal in response to the down bank block column control signal, the down bank block read control signal, and the write enable signal, and generates a down bank SDRAM write global control signal in response to a bank information signal of an activate bank of the down bank block, when the SDR signal and the write enable signal are activated.

23. The semiconductor integrated circuit of claim 22, wherein the up bank global line control signal generating unit comprises:

a first transmission unit that transmits the up bank block column control signal, when the write enable signal is activated;

a second transmission unit that transmits the up bank block read control signal, when the write enable signal is inactivated; and an up bank SDRAM write global line control signal generator that generates an up bank SDRAM activation information signal and the up bank SDRAM write global line control signal, which are activated in response to a bank information signal of any one of activated banks of the up bank block, when the SDR signal and the write enable signal are activated.

24. The semiconductor integrated circuit of claim 22, wherein the down bank global line control signal generating unit comprises:

a first transmission unit that transmits the down bank block column control signal, when the write enable signal is activated;

a second transmission unit that transmits the down bank block read control signal, when the write enable signal is inactivated; and a down bank SDRAM write global line control signal generator that generates a down bank SDRAM activation information signal and the down bank SDRAM write global line control signal, which are activated in response to a bank information signal of any one of activated banks of the down bank block, when the SDR signal and the write enable signal are activated.

25. The semiconductor integrated circuit of claim 16, wherein the transmission block comprises:

an up bank transmission unit that receives the up bank even-numbered global line control signal, the up bank odd-numbered global line control signal, and the up bank SDRAM write global line control signal, and controls the even-numbered global lines, the odd-numbered global lines, and the SDRAM write global line to be selectively driven in the up bank block; and a down bank transmission unit that receives the down bank even-numbered global line control signal, the down bank odd-numbered global line control signal, and the down bank SDRAM write global line control signal, and controls the even-numbered global lines, the odd-numbered global lines, and the SDRAM write global line to be selectively driven in the down bank block.

* * * * *